US012615986B2

(12) United States Patent
Sumi et al.

(10) Patent No.: US 12,615,986 B2
(45) Date of Patent: Apr. 28, 2026

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Noritake Sumi, Kyoto (JP); Hajime Shirakawa, Kyoto (JP); Masaki Inaba, Kyoto (JP); Koji Ando, Kyoto (JP); Tomohiro Motono, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 26 days.

(21) Appl. No.: 18/722,502

(22) PCT Filed: Nov. 16, 2022

(86) PCT No.: PCT/JP2022/042529
§ 371 (c)(1),
(2) Date: Jun. 20, 2024

(87) PCT Pub. No.: WO2023/119964
PCT Pub. Date: Jun. 29, 2023

(65) Prior Publication Data
US 2025/0062116 A1 Feb. 20, 2025

(30) Foreign Application Priority Data
Dec. 22, 2021 (JP) ................................ 2021-207756

(51) Int. Cl.
*H01L 21/02* (2006.01)
*B08B 7/00* (2006.01)
*H01L 21/67* (2006.01)

(52) U.S. Cl.
CPC ...... *H01L 21/02101* (2013.01); *B08B 7/0021* (2013.01); *H01L 21/67034* (2013.01)

(58) Field of Classification Search
CPC ......... H01L 21/02101; H01L 21/67034; H01L 21/67028; H01L 21/304; H01L 21/67051;
(Continued)

(56) References Cited

U.S. PATENT DOCUMENTS

2017/0287769 A1 10/2017 Ota et al.
2018/0155835 A1 6/2018 Kurita et al.
(Continued)

FOREIGN PATENT DOCUMENTS

JP 2018-147945 A 9/2018
JP 2021-009875 A 1/2021
(Continued)

OTHER PUBLICATIONS

Office Action issued in Korean Patent Application No. 10-2024-7023479, dated Apr. 10, 2025 with English translation.
(Continued)

*Primary Examiner* — Alexander Markoff
(74) *Attorney, Agent, or Firm* — OSTROLENK FABER LLP

(57) ABSTRACT

A substrate processing apparatus with a support part that has a substrate-facing surface and supports the substrate in a state of being spaced from the substrate-facing surface. The support part is accommodated into a processing space of a processing chamber. A processing fluid flows in a certain direction in the processing space. In a path for a laminar flow of the processing fluid between the substrate and the support part, a downstream path positioned on a downstream side in the certain direction is wider than an upstream path positioned on an upstream side in the certain direction to reduce the pressure loss of the processing fluid flowing from the upstream path to the downstream path to prevent re-adhesion of the liquid to the substrate.

10 Claims, 7 Drawing Sheets

(58) Field of Classification Search
CPC ............. H01L 21/683; H01L 21/02057; H01L
21/67748; H01L 21/6875; H01L
21/68785; B08B 7/0021; F26B 3/04
See application file for complete search history.

(56) References Cited

U.S. PATENT DOCUMENTS

| | | | |
|---|---|---|---|
| 2018/0254200 A1 | 9/2018 | Kawabuchi et al. | |
| 2018/0355465 A1 | 12/2018 | Saito et al. | |
| 2019/0088469 A1 | 3/2019 | Tanaka et al. | |
| 2019/0172732 A1 | 6/2019 | Naohara et al. | |
| 2020/0047224 A1* | 2/2020 | Fukui | H01L 21/67017 |
| 2020/0098594 A1 | 3/2020 | Kiyohara et al. | |
| 2020/0365437 A1 | 11/2020 | Kawahara et al. | |
| 2020/0411334 A1* | 12/2020 | Sumi | B08B 3/08 |
| 2020/0411336 A1* | 12/2020 | Sumi | H01L 21/68785 |
| 2021/0043471 A1 | 2/2021 | Nakata et al. | |
| 2021/0057235 A1 | 2/2021 | Negoro et al. | |
| 2021/0134627 A1 | 5/2021 | Peng et al. | |
| 2021/0159095 A1* | 5/2021 | Ihara | H01L 21/6719 |
| 2021/0197224 A1 | 7/2021 | Abe et al. | |
| 2021/0324514 A1 | 10/2021 | Ye et al. | |
| 2022/0074052 A1 | 3/2022 | Inatomi et al. | |
| 2023/0028053 A1* | 1/2023 | Kiyohara | H01L 21/67017 |
| 2024/0157410 A1* | 5/2024 | Sumi | B08B 9/08 |
| 2025/0062116 A1* | 2/2025 | Sumi | H01L 21/304 |

FOREIGN PATENT DOCUMENTS

| | | | |
|---|---|---|---|
| JP | 2021-009876 A | | 1/2021 |
| JP | 2021-027170 A | | 2/2021 |
| JP | 2021-125471 | * | 8/2021 |
| JP | 2021-125471 A | | 8/2021 |
| KR | 10-2018-0101227 A | | 9/2018 |
| KR | 2021-0001981 | * | 1/2021 |
| TW | 201735134 A | | 10/2017 |
| TW | 201736006 A | | 10/2017 |
| TW | 201820501 A | | 6/2018 |
| TW | 201833361 A | | 9/2018 |
| TW | 201842975 A | | 12/2018 |
| TW | 201919117 A | | 5/2019 |
| TW | 201937536 A | | 9/2019 |
| TW | 201938766 A | | 10/2019 |
| TW | 202029316 A | | 8/2020 |
| TW | 202036758 A | | 10/2020 |
| TW | 202044393 A | | 12/2020 |
| TW | 202101555 A | | 1/2021 |
| TW | 202135202 A | | 9/2021 |
| TW | 202138066 A | | 10/2021 |
| TW | 202139332 A | | 10/2021 |
| TW | 202144610 A | | 12/2021 |

OTHER PUBLICATIONS

Office Action mailed Jan. 14, 2025 in corresponding Taiwanese Patent Application No. 113142844.
International Search Report mailed Feb. 7, 2023 in corresponding PCT International Application No. PCT/JP2022/042529.
Office Action issued on Sep. 8, 2025 for the corresponding Taiwanese Patent Application No. 114127862.

* cited by examiner

FIG. 1A

F I G.  1 B
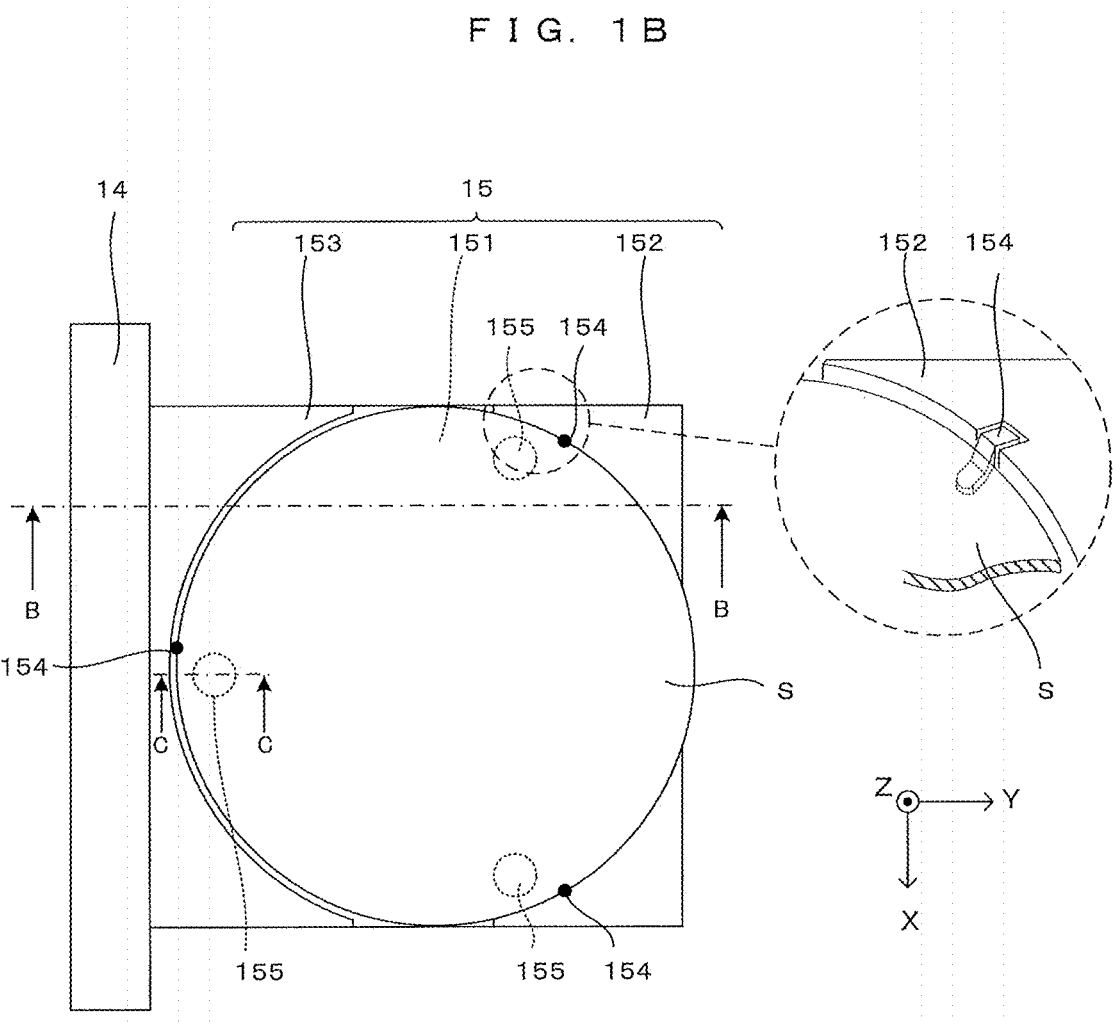

F I G. 2
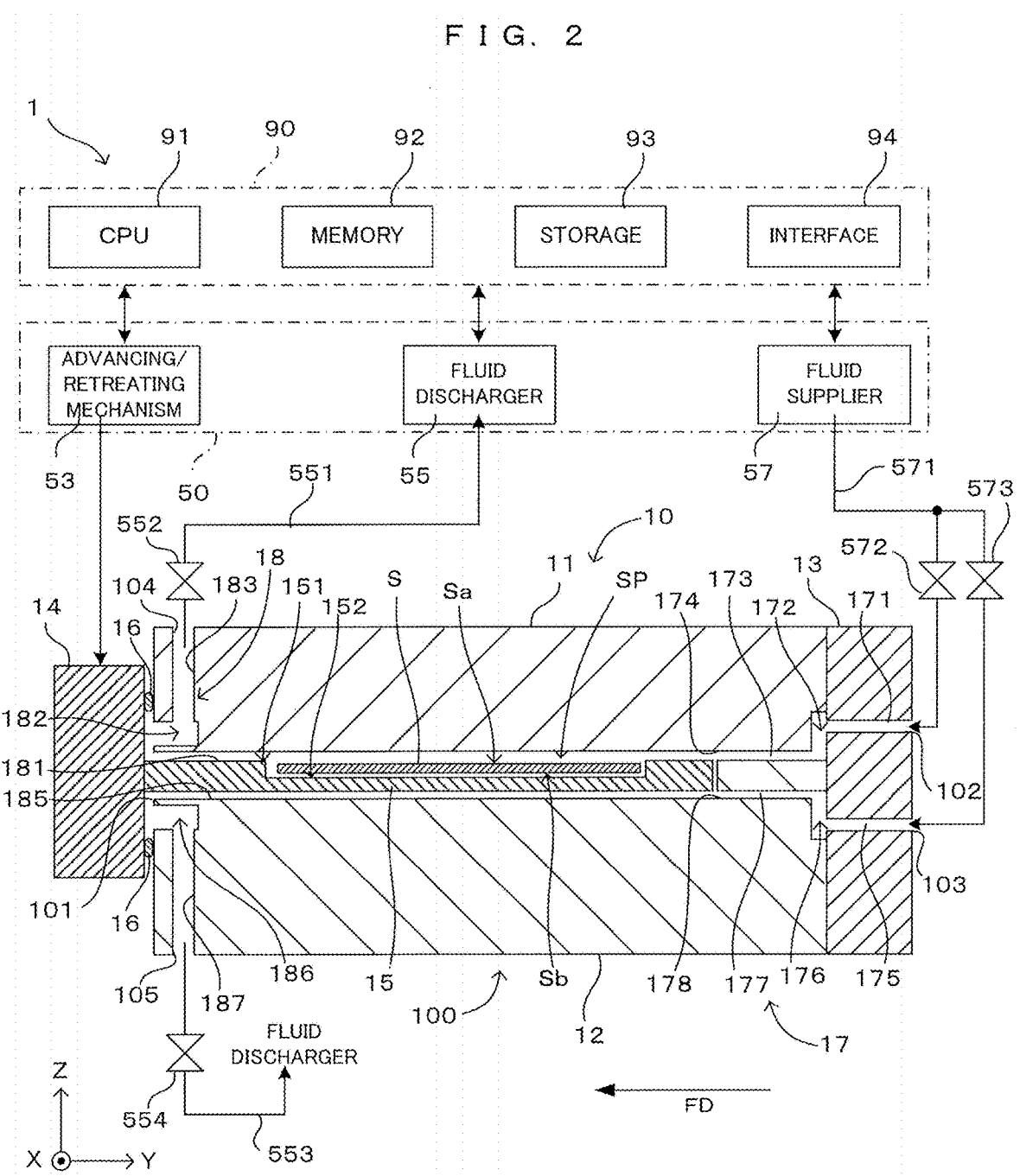

F I G.  3
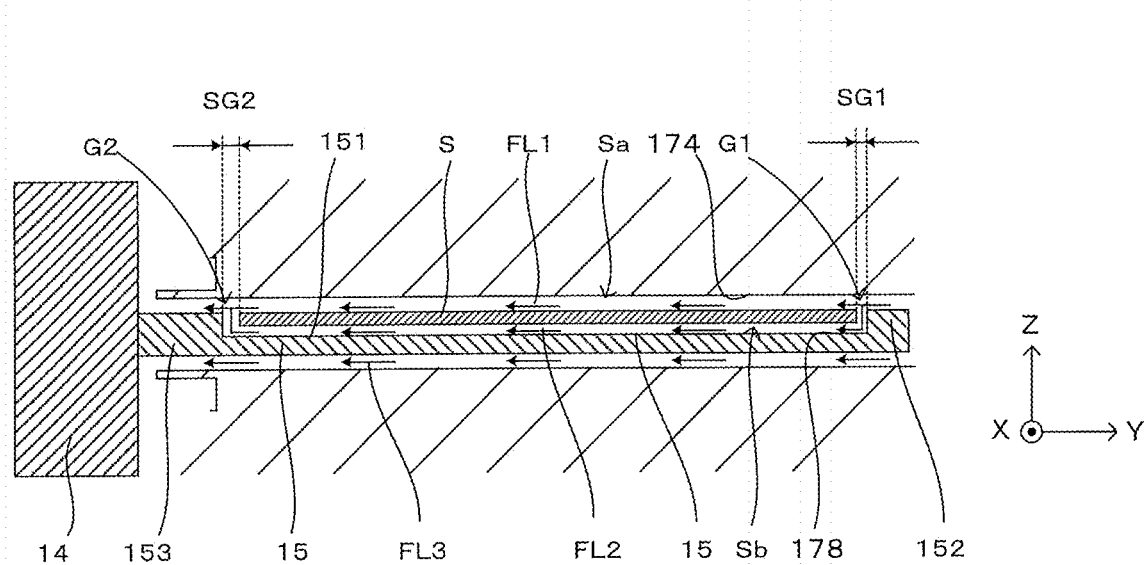
F I G.  4
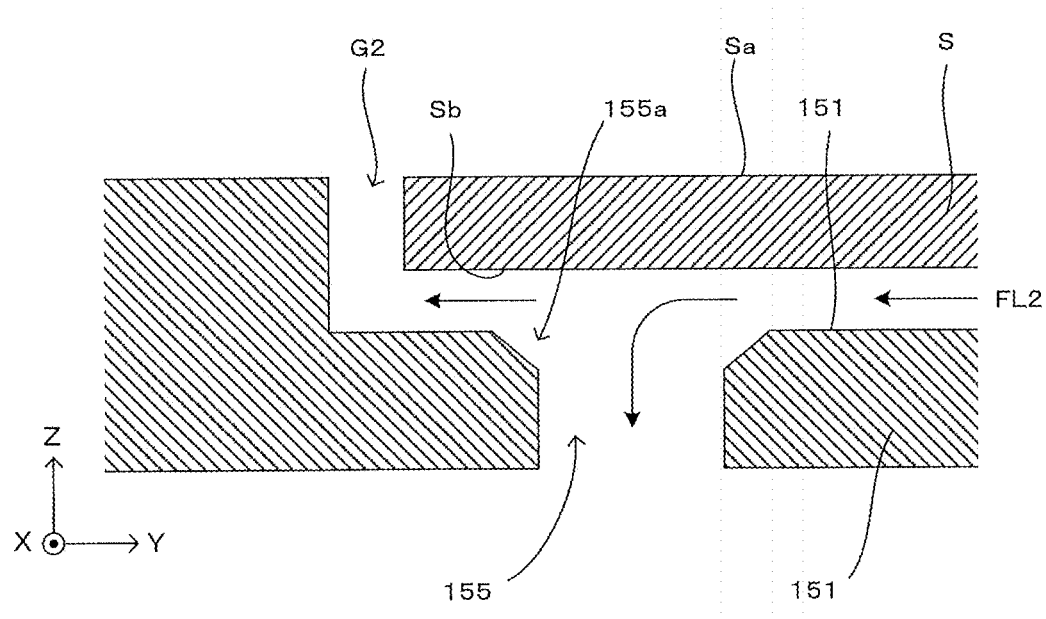

F I G. 5
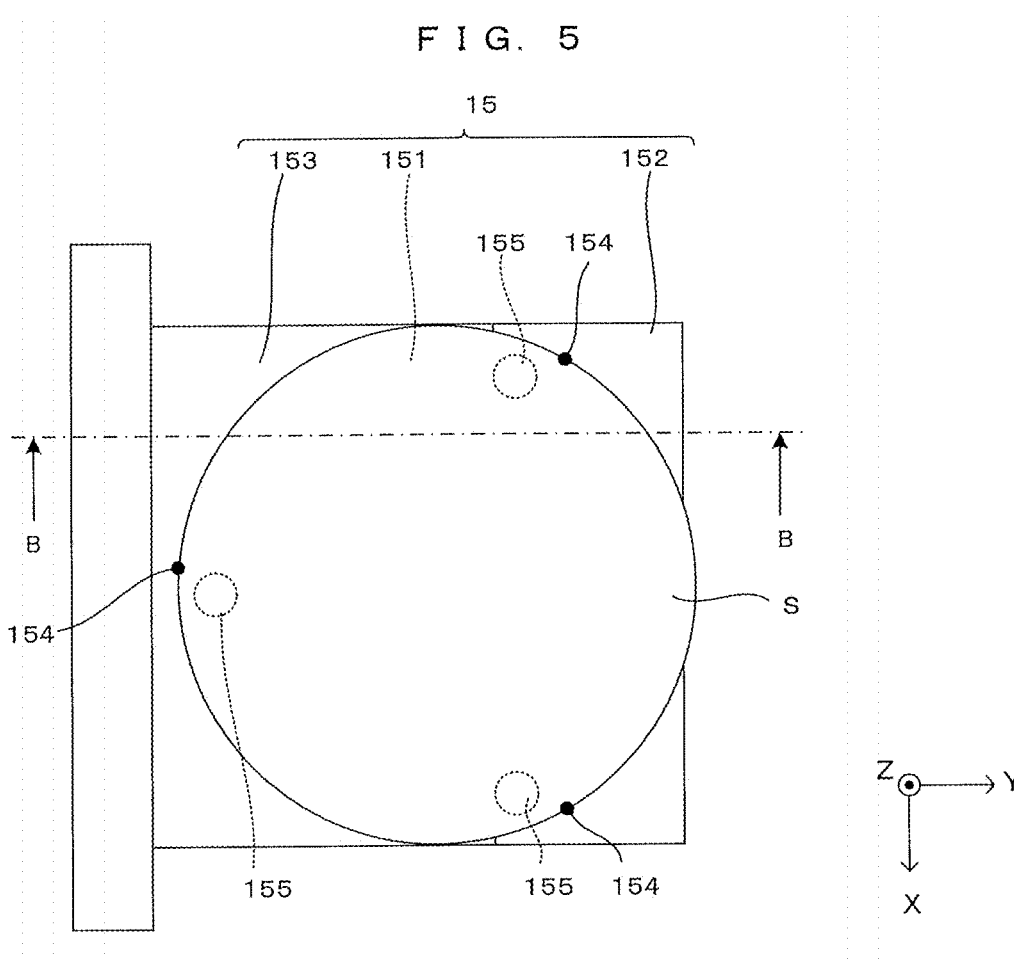
F I G. 6
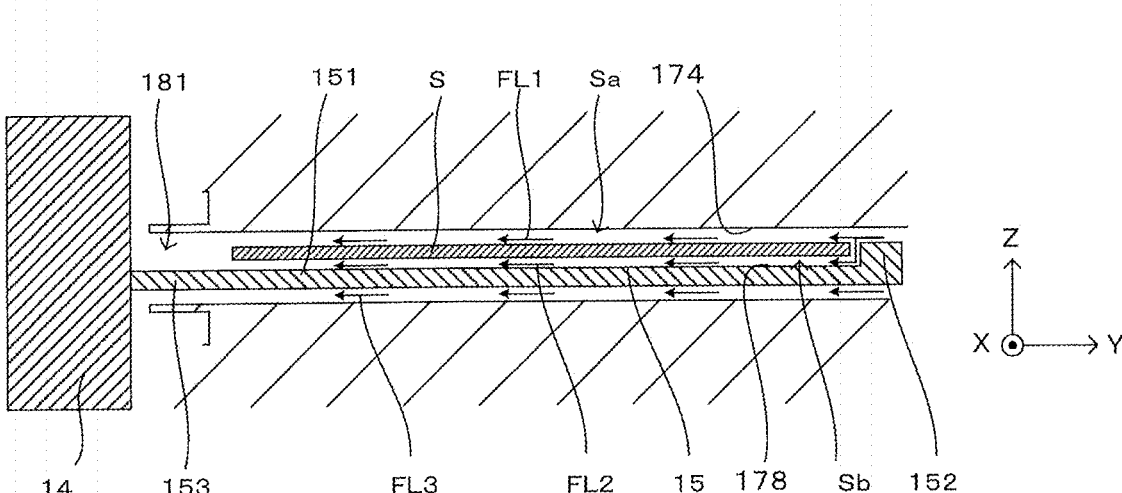

F I G .  9
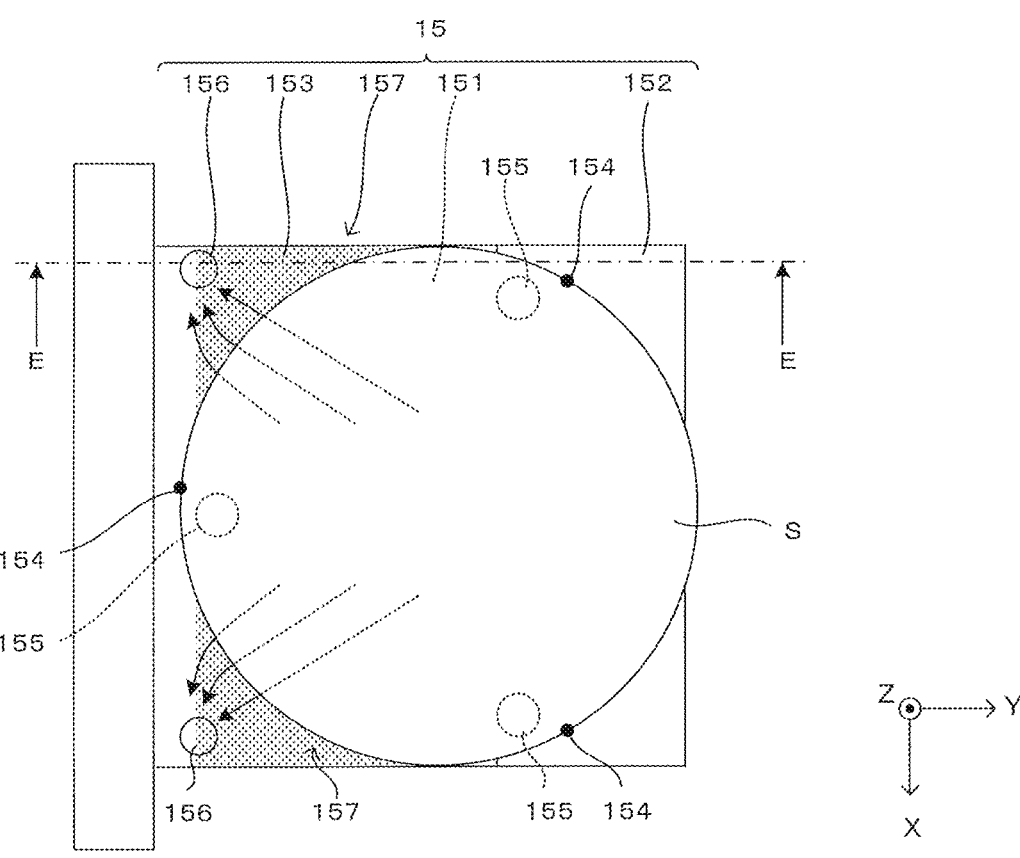
F I G .  1 0
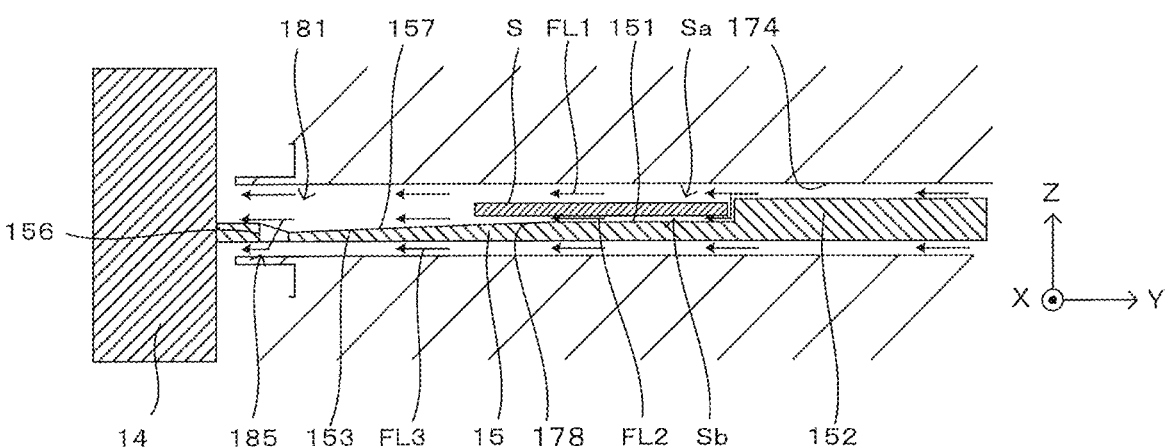

SUBSTRATE PROCESSING APPARATUS AND SUBSTRATE PROCESSING METHOD

TECHNICAL FIELD

This invention relates to a substrate processing apparatus and a substrate processing method for processing a substrate with a liquid adhered thereon by a processing fluid in a supercritical state.

The disclosure of Japanese Patent Application No. 2021-207756 filed on Dec. 22, 2021 including specification, drawings and claims is incorporated herein by reference in its entirety.

BACKGROUND

When wet processing is performed on a substrate by a liquid, the liquid is adhered on an upper surface of the substrate. As a substrate processing apparatus which dries the substrate after this wet processing, known is an apparatus disclosed in, for example, Patent Literature 1. In this apparatus, a drying process is performed on a substrate by a processing fluid in a supercritical state while the substrate is supported inside a recess provided in a support tray.

In this substrate processing apparatus, the substrate is supported by the support tray in a face-up position with an upper surface having a fine pattern thereon facing upward. More specifically, the substrate is disposed away upward from an inner bottom surface of the recess by a certain distance in a horizontal position. The support tray is accommodated into a processing chamber while supporting the substrate. In this processing chamber, a processing fluid having a surface tension lower than a liquid is flowed in a certain direction. Part of the processing fluid, which flows along the upper surface of the substrate, among the above-described processing fluid, enters into the fine pattern formed on the upper surface of the substrate. For this reason, the drying process can be efficiently performed, and it is possible to reduce a risk of occurrence of pattern collapse caused by the surface tension in drying.

CITATION LIST

Patent Literature

[Patent Literature 1] Japanese Patent Application Laid Open Gazette No. 2021-9875

SUMMARY

Technical Problem

Part of the processing fluid flowing inside the processing chamber flows into between the support tray and the substrate and forms a laminar flow. It is desired to efficiently discharge a liquid removed from the substrate, from the processing chamber along the laminar flow. In a background-art apparatus, however, the discharge efficiency is not always high and sometimes the liquid removed from the substrate is adhered on the upper surface of the substrate again.

This invention is intended to solve the above-described problem, and it is an object of this invention to provide a substrate processing apparatus and a substrate processing method capable of preventing re-adhesion of a liquid on a substrate when the liquid is removed from the substrate by a processing fluid.

Solution to Problem

One aspect of this invention is directed to a substrate processing apparatus for processing a substrate with a liquid adhered thereon by a processing fluid in a supercritical state. The apparatus comprises: a processing chamber having a processing space in which the substrate is processed: a support part configured to be accommodated into the processing space while supporting the substrate in a horizontal position: a fluid supplier configured to supply the processing fluid into the processing chamber, to thereby cause the processing fluid to flow in a certain direction in the processing space: and a fluid discharger configured to discharge the processing fluid from the processing chamber, wherein the support part has a substrate-facing surface facing a lower surface of the substrate and supports the substrate in a state of being separated away upward from the substrate-facing surface, and in a path for a laminar flow of a partial processing fluid out of the processing fluid, which flows between the substrate and the support part, a downstream path positioned on a downstream side in the certain direction is wider than an upstream path positioned on an upstream side in the certain direction.

Other aspect of the invention is a substrate processing method for processing a substrate with a liquid adhered thereon by a processing fluid in a supercritical state. The method comprises: (a) accommodating a support part into a processing space of a processing chamber, the support part being configured to support the substrate in a horizontal position while the substrate is separated upward from a substrate-facing surface facing a lower surface of the substrate: and (b) processing the substrate supported by the support part inside the processing space by using the processing fluid, by supplying the processing fluid into the processing chamber that accommodates the support part therein to thereby cause the processing fluid to flow in a certain direction in the processing space and discharging the processing fluid that flows in the certain direction along an upper surface of the substrate and the processing fluid that flows between the support part and the substrate, from the processing chamber, wherein the processing fluid flows along a path in which a downstream path formed between the support part and the substrate and positioned on a downstream side in the certain direction is wider than an upstream path positioned on an upstream side in the certain direction in the operation (b).

In the invention having the above-described configuration, the processing on the lower surface of the substrate is performed by the laminar flow of the processing fluid flowing between the substrate and the support part. The path of this laminar flow is formed so that the downstream path positioned on the downstream side in the certain direction can be wider than the upstream path positioned on the upstream side in the certain direction. For this reason, pressure loss of the processing fluid flowing from the upstream path to the downstream path is reduced.

ADVANTAGEOUS EFFECTS OF INVENTION

Thus, since the pressure loss of the processing fluid flowing between the substrate and the support part is reduced, it is possible to prevent re-adhesion of the liquid on the substrate when the liquid is removed from the substrate by the processing fluid.

All of a plurality of constituent elements of each aspect of the invention described above are not essential and some of the plurality of constituent elements can be changed, deleted or replaced by new other constituent elements or limitation contents can be partially deleted as appropriate to solve some or all of the problems described above or achieve some or all of effects described in this specification.? Further, some or all of technical features included in one aspect of the invention described above can be combined with some or all of technical features included in another aspect of the invention described above into one independent aspect of the invention to solve some or all of the problems described above or achieve some or all of effects described in this specification.

BRIEF DESCRIPTION OF DRAWINGS

FIG. 1A is a plan view showing a processing unit and a transfer mechanism equipped in a first embodiment of a substrate processing apparatus in accordance with the present invention, as viewed from vertically above:

FIG. 1B is a plan view showing a lid member and a support tray which are constituent elements of the processing unit, and a substrate supported by the support tray, as viewed from vertically above:

FIG. 2 is a view showing a schematic configuration of the first embodiment:

FIG. 3 is a view schematically showing a flow channel and a laminar flow of a processing fluid inside a processing chamber:

FIG. 4 is a view schematically showing a structure of an elevating through hole for a lift pin:

FIG. 5 is a plan view showing the lid member, the support tray, and the substrate supported by the support tray in a second embodiment of the substrate processing apparatus in accordance with the present invention, as viewed from vertically above;

FIG. 6 is a view schematically showing the flow channel and the laminar flow of the processing fluid inside the processing chamber in the second embodiment;

FIG. 9 is a plan view showing the lid member, the support tray, and the substrate supported by the support tray in a fourth embodiment of the substrate processing apparatus in accordance with the present invention, as viewed from vertically above; and FIG. 10 is a view schematically showing the flow channel and the laminar flow of the processing fluid inside the processing chamber in the fourth embodiment.

DESCRIPTION OF EMBODIMENTS

Figure 1A:
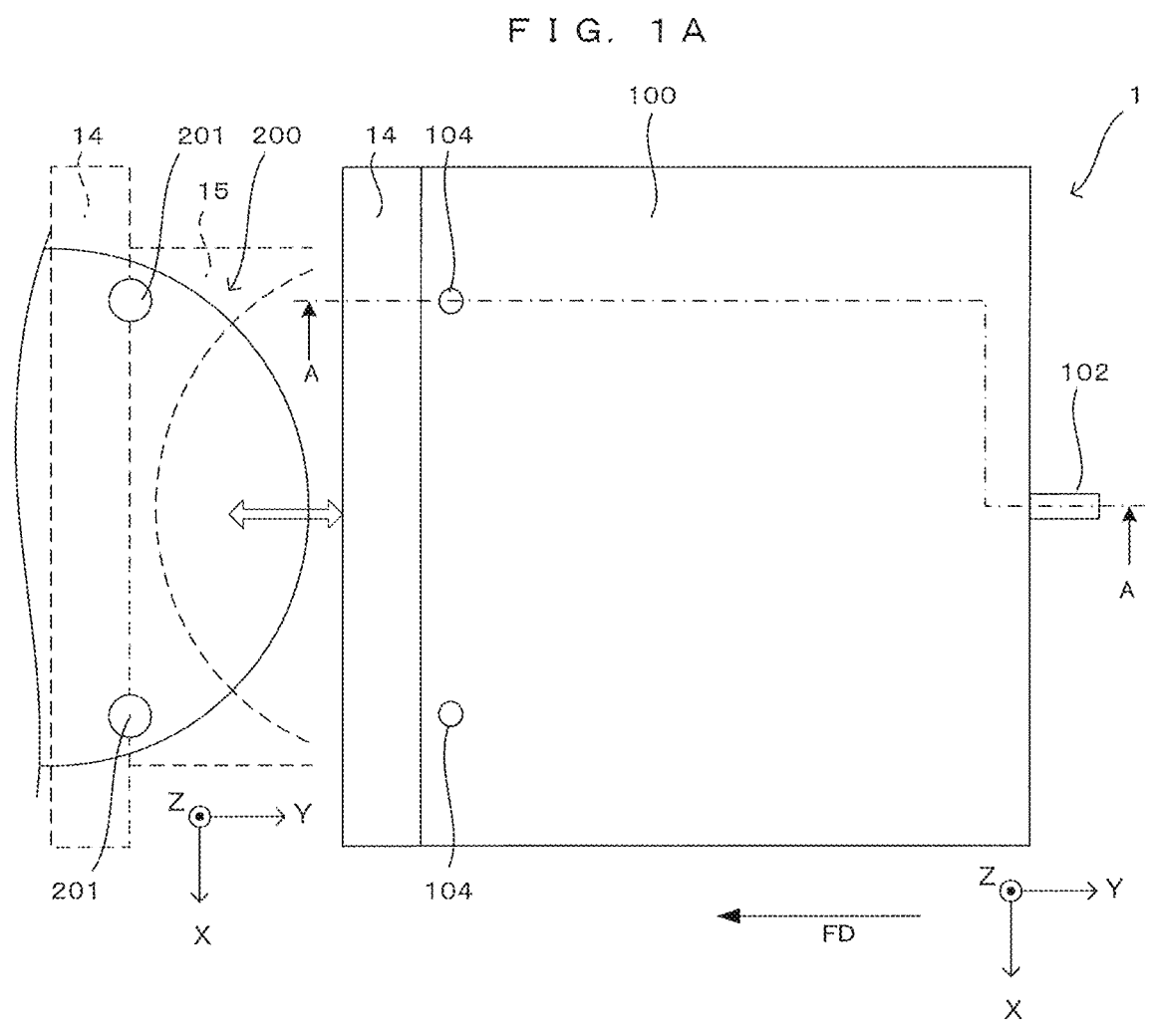
Figure 7:
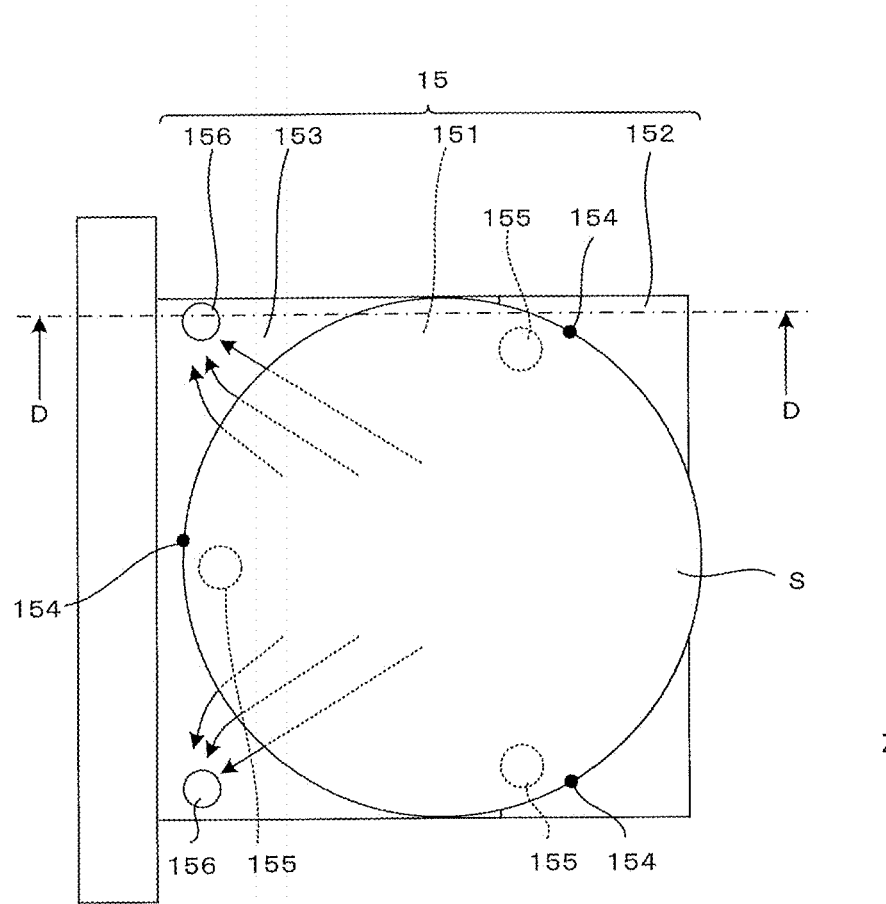
FIG. 7 is a plan view showing the lid member, the support tray, and the substrate supported by the support tray in a third embodiment of the substrate processing apparatus in accordance with the present invention, as viewed from vertically above.

FIG. 1A is a plan view showing a processing unit and a transfer mechanism equipped in a first embodiment of a substrate processing apparatus in accordance with the present invention, as viewed from vertically above. FIG. 1B is a plan view showing a lid member and a support tray which are constituent elements of the processing unit, and a substrate supported by the support tray, as viewed vertically above. FIG. 2 is a view showing a schematic configuration of the first embodiment, and a lower part of FIG. 2 shows a cross section taken along the A-A line of FIG. 1A. This substrate processing apparatus 1 is an apparatus for processing an upper surface of any one of various substrates such as a semiconductor substrate by using a supercritical fluid. To show directions in each of the following figures in a unified manner, an XYZ orthogonal coordinate system is set as shown in FIGS. 1A, 1B, and 2. Herein, an XY plane is a horizontal plane and a Z direction represents a vertical direction. More specifically, a (−Z) direction represents a vertically downward direction.

Herein, as the "substrate" in the present embodiment, any one of various substrates can be adopted, such as a semiconductor wafer, a glass substrate for photomask, a glass substrate for liquid crystal display, a glass substrate for plasma display, a substrate for FED (Field Emission Display), a substrate for optical disk, a substrate for magnetic disk, a substrate for magneto-optical disk, and the like. Though a substrate processing apparatus used to process a semiconductor wafer will be mainly described below as an example with reference to the drawings, the substrate processing apparatus of the present invention can be similarly adopted to process any one of various substrates exemplarily described above.

The substrate processing apparatus 1 includes a processing unit 10, a supply unit 50 and a control unit 90. The processing unit 10 serves as a main unit for performing a supercritical drying process, and the supply unit 50 supplies chemical substances and power necessary for the process to the processing unit 10.

The control unit 90 controls these constituent elements of the apparatus, to thereby achieve a predetermined process. For this purpose, the control unit 90 includes a CPU 91 for executing various control programs, a memory 92 for temporarily storing therein processing data, a storage 93 for storing therein the control programs to be executed by the CPU 91, an interface 94 used for performing information exchange with a user and an external apparatus, and the like. An operation of the apparatus described later is achieved when the CPU 91 executes the control program written into the storage 93 in advance, to thereby cause each constituent element of the apparatus to perform a predetermined operation.

The processing unit 10 includes a processing chamber 100. The processing chamber 100 includes a first member 11, a second member 12 and a third member 13 each formed by a metal block. The first and second members 11 and 12 are joined by a not-shown joining member in an up-and-down direction, and the third member 13 is joined to (+Y) side surfaces of the first and second members 11 and 12 by a not-shown joining member, to thereby form the processing chamber 100 structured to be hollow inside. This hollow internal space serves as a processing space SP in which a substrate S is processed. The substrate S to be processed is loaded into the processing space SP and then processed. A slit-like opening 101 elongated in an X direction is formed in a (−Y) side surface of the processing chamber 100, and the processing space SP communicates with an outside space through the opening 101.

A lid member 14 is provided on the (−Y) side surface of the processing chamber 100 to close the opening 101. A support tray 15 having a flat plate shape is attached in a horizontal position to a (+Y) side surface of the lid member 14, and an upper surface of the support tray 15 serves as a support surface on which the substrate S can be placed. In the present embodiment, a configuration to prevent a liquid removed from the substrate S during the supercritical drying process from re-adhesion on the substrate S is given to the support tray 15. The configuration and function of this support tray 15 will be described in detail later.

The lid member 14 is so supported as to be horizontally movable in a Y direction by a not-shown support mechanism. Further, the lid member 14 is movable toward and away from the processing chamber 100 by an advancing/retreating mechanism 53 provided in the supply unit 50. Specifically, the advancing/retreating mechanism 53 includes a linear motion mechanism such as a linear motor, a linear guide, a ball-screw mechanism, a solenoid, an air cylinder, or the like, and such a linear motion mechanism moves the lid member 14 in the Y direction. The advancing/retreating mechanism 53 operates in response to a control command from the control unit 90.

When the support tray 15 is pulled out from the processing space SP to the outside through the opening 101 by a movement of the lid member 14 in a (−Y) direction, the support tray 15 becomes accessible from the outside. Specifically, it becomes possible to place the substrate S onto the support tray 15 and take out the substrate S placed on the support tray 15. On the other hand, by a movement of the lid member 14 in a (+Y) direction, the support tray 15 is accommodated into the processing space SP. In a case where the substrate S is placed on the support tray 15, the substrate S is loaded into the processing space SP together with the support tray 15 (accommodating step).

In the supercritical drying process performed mainly for the purpose of drying the substrate while preventing pattern collapse caused by a surface tension of the liquid, the substrate S is loaded with an upper surface Sa thereof covered with a liquid film in order to prevent occurrence of the pattern collapse due to exposure of the upper surface Sa of the substrate S. As a liquid forming the liquid film, an organic solvent having a relatively low surface tension, such as isopropyl alcohol (IPA), acetone, or the like, can be preferably used.

When the lid member 14 moves in the (+Y) direction to close the opening 101, the processing space SP is sealed. A sealing member 16 is provided between the (+Y) side surface of the lid member 14 and the (−Y) side surface of the processing chamber 100, to thereby maintain an airtight state of the processing space SP. As the sealing member 16, An annular member formed of an elastic resin material such as rubber can be used. Further, the lid member 14 is fixed to the processing chamber 100 by a not-shown lock mechanism. In a state where the airtight state of the processing space SP is thereby ensured, the substrate S is processed inside the processing space SP (processing step).

In this embodiment, a fluid of a substance that can be used for a supercritical process, e.g., carbon dioxide, is supplied in a gaseous or liquid state to the processing unit from a fluid supplier 57 provided in the supply unit 50. Carbon dioxide is a chemical substance suitable for the supercritical drying process in terms of being brought into a supercritical state at relatively low temperature and low pressure and having a property of dissolving an organic solvent well which is frequently used for substrate processing.

More specifically, the fluid supplier 57 outputs a fluid in a supercritical state or a fluid to be brought into the supercritical state after being supplied in a gaseous or liquid state and given thereto predetermined temperature and pressure, as the processing fluid used for processing the substrate S. For example, carbon dioxide in the gaseous or liquid state is outputted in a pressurized state. The processing fluid is fed under pressure into input ports 102 and 103 provided in the (+Y) side surface of the processing chamber 100 through a pipe 571 and valves 572 and 573 interposed at some midpoint therein. Specifically, by opening the valves 572 and 573 in response to the control command from the control unit 90, the processing fluid is transferred from the fluid supplier 57 to the processing chamber 100 (supplying step). As a result, inside the processing chamber 100, the processing fluid flows from the (+Y) side to the (−Y) side thereof. This flow direction FD (see FIGS. 1A and 2) corresponds to one example of a "certain direction" of the present invention.

The processing fluid which is supplied thus forms three types of laminar flows inside the processing chamber 100. Among these, an upper-stage laminar flow (represented by reference sign "FL1" in FIG. 3) flows along the upper surface Sa of the substrate S supported by the support tray 15 and is supplied onto the upper surface Sa. Further, a middle-stage laminar flow (represented by reference sign "FL2" in FIG. 3) flows along a lower surface Sb of the substrate S and is supplied onto the lower surface Sb. Furthermore, a lower-stage laminar flow (represented by reference sign "FL3" in FIG. 3) flows along a lower surface of the support tray 15. Before describing these laminar flows, a configuration of the support tray 15 will be described, with reference to FIGS. 1B and 2.

An upper-surface central region of the support tray 15 serves as a substrate-facing surface 151 for supporting the lower surface Sb of the substrate S while facing the lower surface Sb. More specifically, a central region of the support tray 15 in the flow direction FD is finished to be a substantially flat surface and serves as the substrate-facing surface 151. Further, two supply guide portions 152, 152 are provided on an upstream side of the substrate-facing surface 151, i.e., on the (+Y) side thereof, standing upward, i.e., in a (+Z) direction, from the substrate-facing surface 151. As shown in FIG. 1B, the supply guide portions 152, 152 are adjacently disposed, providing a small gap (represented by reference sign "G1" in FIG. 3) on a (+Y) side of the substrate S, so as to sandwich the substrate S from the X direction, which is supported while facing the substrate-facing surface 151.

Further, a discharge guide portion 153 stands upward from the substrate-facing surface 151 on a downstream side of the substrate-facing surface 151, i.e., on the (−Y) side thereof. As shown in FIG. 1B, the discharge guide portion 153 is disposed, providing a gap (represented by reference sign "G2" in FIG. 3) on a (−Y) side of the substrate S which is supported while facing the substrate-facing surface 151, which is slightly wider than that on the (+Y) side thereof, from the substrate S. The supply guide portions 152, 152 and the discharge guide portion 153 are each provided with a support member 154 (see a partially-enlarged view in FIG. 1B) for supporting the substrate S from below and from the side.

These three support members 154 can pass and receive the substrate S to/from the transfer mechanism 200 of the substrate processing apparatus 1. More specifically, as indicated by a broken line in FIG. 1A, the empty support tray 15 is pulled out from the processing chamber 100 in the (−Y) direction. The entire support tray 15 is thereby exposed from the processing chamber 100 and three through holes 155 provided in the substrate-facing surface 151 are positioned on an elevating path for a lift pin 201. The through hole 155 has an inner diameter which is slightly larger than an outer diameter of the lift pin 201. For this reason, the lift pin 201 is freely movable into and out from the through hole 155 in a vertical direction Z. Further, the operation of loading and unloading the substrate S into and out from the support tray 15 by using the lift pin 201 of the transfer mechanism 200 is well known as disclosed in, for example, Japanese Patent Application Laid Open Gazette No. 2021-125471. Therefore, description of the transfer operation will be omitted herein.

After the substrate S is transferred by the transfer mechanism 200 to the support member 154 of the support tray 15, the substrate S is held with the upper surface (hereinafter, sometimes referred to simply as a "substrate upper surface") Sa thereof to be processed facing upward. At that time, it is preferable that upper surfaces of the supply guide portions 152, 152 and the discharge guide portion 153 should be coplanar with, i.e., flush with the substrate upper surface Sa. Then, the substrate S is processed by the processing fluid flowing inside the processing chamber 100 in the following manner while being held by the support tray 15.

FIG. 3 is a view schematically showing a flow channel and a laminar flow of the processing fluid inside the processing chamber, and shows a cross section taken along the B-B line of FIG. 1A. FIG. 4 is a view schematically showing a structure of an elevating through hole for the lift pin, and shows a cross section taken along the C-C line of FIG. 1A. By using the support tray 15 having the above-described configuration, the processing fluid supplied from the fluid supplier 57 to the processing chamber 100 flows along the three types of flow channels, as shown in FIG. 3. As a result, the upper-stage laminar flow FL1, the middle-stage laminar flow FL2, and the lower-stage laminar flow FL3 are formed. Hereinafter, the flow channel and the laminar flow of the processing fluid will be described, with reference to FIGS. 1B, 2, and 3.

As shown in FIG. 2, a flow channel 17 of the processing fluid extending from the input ports 102 and 103 to the processing space SP serves as an introduction flow channel for introducing the processing fluid supplied from the fluid supplier 57 to the processing space SP. Specifically, a flow channel 171 is connected to the input port 102. At an end portion of the flow channel 171 on a side opposite to the input port 102, provided is a buffer space 172 which is so formed as to sharply enlarge a flow channel cross-sectional area.

A flow channel 173 is further provided to connect the buffer space 172 and the processing space SP. The flow channel 173 has a wide cross-sectional shape which is narrow in the up-and-down direction (Z direction) and long in a horizontal direction (X direction), and the cross-sectional shape is substantially constant in a flowing direction of the processing fluid. An end portion of the flow channel 173 on a side opposite to the buffer space 172 serves as a discharge port 174 which is open to the processing space SP, and the processing fluid is introduced into the processing space SP from this discharge port 174.

Desirably, a height of the flow channel 173 is equal to a distance between a ceiling surface of the processing space SP and the substrate upper surface Sa with the support tray 15 accommodated in the processing space SP. The discharge port 174 is open to a gap between the ceiling surface of the processing space SP and the substrate-facing surface 151 of the support tray 15. For example, the ceiling surface of the flow channel 173 and the ceiling surface of the processing space SP can be coplanar. As just described, the discharge port 174 is open in the form of a slit elongated in the horizontal direction, to the processing space SP. The processing fluid from this discharge port 174 flows toward the substrate upper surface Sa directly and through the upper surfaces of the supply guide portions 152, 152. Most of this processing fluid flows in the flow direction FD without changing the direction. The upper-stage laminar flow FL1 flowing between the ceiling surface of the processing space SP and the substrate upper surface Sa is thereby formed.

Further, as shown in FIG. 3, part of the processing fluid flowing toward the substrate upper surface Sa goes around onto the lower surface (hereinafter, sometimes referred to simply as a "substrate lower surface") Sb of the substrate S through the gap G1 between the supply guide portion 152 and the substrate S. Then, the processing fluid flows in the flow direction FD between a bottom surface of the processing space SP and the substrate lower surface Sb. Thus, the middle-stage laminar flow FL2 is formed. The processing fluid forming this middle-stage laminar flow FL2 meets the processing fluid forming the upper-stage laminar flow FL1 at the gap G2 and then further flows in the flow direction FD.

A flow channel of the processing fluid is also similarly formed below the support tray 15. Specifically, a flow channel 175 is connected to the input port 103. At an end portion of the flow channel 175 on a side opposite to the input port 103, provided is a buffer space 176 which is so formed as to sharply enlarge a flow channel cross-sectional area.

The buffer space 176 and the processing space SP communicate with each other through a flow channel 177. The flow channel 177 has a wide cross-sectional shape which is narrow in the up-and-down direction (Z direction) and long in the horizontal direction (X direction), and that cross-sectional shape is substantially constant in the flowing direction of the processing fluid. An end portion of the flow channel 177 on a side opposite to the buffer space 176 serves as a discharge port 178 which is open to the processing space SP, and the processing fluid is introduced into the processing space SP from this discharge port 178.

Desirably, a height of the flow channel 177 is equal to a distance between the bottom surface of the processing space SP and the lower surface of the support tray 15. The discharge port 178 is open to a gap between the bottom surface of the processing space SP and the lower surface of the support tray 15. For example, the bottom surface of the flow channel 177 and the bottom surface of the processing space SP can be coplanar. In other words, the discharge port 178 is open in the form of a slit elongated in the horizontal direction, to the processing space SP. The processing fluid from this discharge port 178 flows in the flow direction FD between the support tray 15 and the bottom surface of the processing space SP through the lower surfaces of the supply guide portions 152, 152. Thus, the lower-stage laminar flow FL3 is formed.

As described above, the processing fluid which flows inside the processing space PS, being divided into the upper-stage laminar flow FL1, the middle-stage laminar flow FL2, and the lower-stage laminar flow FL3 is discharged to the outside of a processing container through an exhaust flow channel 18 configured in the following manner (discharging step). On the (−Y) side with respect to the substrate S, the ceiling surface of the processing space SP and the substrate-facing surface 151 of the support tray 15 are each a horizontal plane and these surfaces face each other in parallel while keeping a constant gap therebetween. This gap serves as an upstream region 181 of the exhaust flow channel 18 which introduces the processing fluid having flowed along the substrate-facing surface 151 of the support tray 15 and the substrate upper surface Sa of the substrate S to a fluid discharger 55. This upstream region 181 has a wide cross-sectional shape which is narrow in the up-and-down direction (Z direction) and long (X direction).

An end portion of the upstream region 181 on a side opposite to the processing space SP is connected to a buffer space 182. The buffer space 182 is a space enclosed by the processing chamber 100, the lid member 14 and the sealing member 16. A width of the buffer space 182 in the X direction is equal to or larger than that of the upstream region 181, and a height of the buffer space 182 in the Z direction is larger than that of the upstream region 181. Therefore, the buffer space 182 has a larger flow channel cross-sectional area than the upstream region 181.

A downstream region 183 is connected to an upper part of the buffer space 182. The downstream region 183 is a through hole provided, penetrating the first member 11 which is an upper block constituting the processing chamber 100. An upper end of the downstream region 183 constitutes an output port 104 which is open in the upper surface of the processing chamber 100, and a lower end thereof is open to the buffer space 182.

As just described, in the present embodiment, the exhaust flow channel 18 on an upper surface side of the support tray 15 has the following three regions, i.e., the upstream region 181 formed between the substrate-facing surface 151 of the support tray 15 and a lower surface of the first member 11, the downstream region 183 connected to the fluid discharger 55, and an intermediate region (buffer space 182) allowing communication between the upstream region 181 and the downstream region 183.

Similarly, both the bottom surface of the processing space SP and the lower surface of the support tray 15 are horizontal flat surfaces, and both are facing each other in parallel while keeping a constant gap therebetween. This gap serves as an upstream region 185 of the exhaust flow channel 18 for introducing the processing fluid flowing along the lower surface of the support tray 15 to the fluid discharger 55. Further, the upstream region 185 on a lower surface side of the support tray 15 is connected to a downstream region 187 through a buffer space 186, like on the upper surface side of the support tray 15. Specifically, the exhaust flow channel 18 on the lower surface side of the support tray 15 has the following three regions, i.e., the upstream region 185 formed between the lower surface of the support tray 15 and an upper surface of the second member 12, the downstream region 187 connected to the fluid discharger 55, and an intermediate region (buffer space 186) allowing communication between the upstream region 185 and the downstream region 187.

The processing fluid having flowed above the support tray 15 in the processing space SP is sent out to the output port 104 through the upstream region 181, the buffer space 182, and the downstream region 183. The output port 104 is connected to the fluid discharger 55 with a pipe 551, and at some midpoint in the pipe 551, a valve 552 is interposed.

Similarly, the processing fluid having flowed below the support tray 15 in the processing space SP is sent out to an output port 105 through the upstream region 185, the buffer space 186, and the downstream region 187. The output port is connected to the fluid discharger 55 with a pipe 553, and at some midpoint in the pipe 553, a valve 554 is interposed.

The valves 552 and 554 are controlled by the control unit 90. When the valves 552 and 554 are opened in response to the control command from the control unit 90, the processing fluid inside the processing space SP is collected into the fluid discharger 55 through the pipes 551 and 553.

In the substrate processing apparatus 1 having the above-described configuration, in order to prevent re-adhesion of the liquid on the substrate S when the liquid is removed from the substrate S by using the processing fluid, such characteristic constituent elements as described below are provided in the present embodiment.

As shown in FIGS. 1B and 3, on the (+Y) side and the (−Y) side of the substrate S held by the support member 154, the supply guide portion 152 and the discharge guide portion 153 are provided, respectively. Further, the gap G1 between the substrate S and the supply guide portion 152 and the gap G2 between the substrate S and the discharge guide portion 153 are present. Herein, the gaps G1 and G2 are provided so that the size SG2 of the gap G2 can become larger than the size SG1 of the gap G1 in the flow direction FD. Such a structure is referred to as a "downstream-side gap enlarged structure". Specifically, by adopting the downstream-side gap enlarged structure, in the laminar flow of the processing fluid flowing between the substrate S and the support tray 15, i.e., in the path of the middle-stage laminar flow FL2, a downstream path positioned on the downstream side (i.e., the (−Y) side) in the flow direction FD is wider than an upstream path positioned on the upstream side (i.e., the (+Y) side) in the flow direction FD. In other words, a flow channel cross-sectional area on the downstream side is larger than that on the upstream side. Therefore, the pressure loss in the path of the middle-stage laminar flow FL2 is reduced. As a result, the flow rate of the processing fluid in the path becomes higher than that in the background art, and the liquid removed from the substrate S (isopropyl alcohol (IPA), acetone, or the like) can be efficiently discharged from the processing chamber 100. In other words, it is possible to prevent re-adhesion of the liquid on the substrate S when the liquid is removed from the substrate S by using the processing fluid.

Further, the through hole 155 is provided in order to loosely insert the lift pin 201 therein. In the first embodiment, as shown in FIG. 4, an opening 155a of the through hole 155 on the side of the substrate-facing surface 151 is tapered (tapered structure). Specifically, the opening 155a is expanded into a trumpet shape toward the path of the middle-stage laminar flow FL2. A resistance generated when the processing fluid forming the middle-stage laminar flow FL2 flows into the through hole 155 through the opening 155a is lower than that in the background art, and the pressure loss can be reduced. As a result, by adopting the above-described tapered structure, the same action and effect as in the downstream-side gap enlarged structure can be produced. Thus, in the first embodiment, the through hole 155 for elevating the lift pin corresponds to one example of a "second through hole" of the present invention. Further, the tapered structure may be applied to a bypass-dedicated through hole (represented by reference sign "156" in FIGS. 7 to 10) described later.

In this first embodiment, the support tray 15 corresponds to one example of a "support part" of the present invention. Further, the sizes SG1 and SG2 correspond to a "separation distance of the supply guide portion from the substrate" and a "separation distance of the discharge guide portion from the substrate" of the present invention, respectively.

FIG. 5 is a plan view showing the lid member, the support tray, and the substrate supported by the support tray in a second embodiment of the substrate processing apparatus in accordance with the present invention, as viewed from vertically above. FIG. 6 is a view schematically showing the flow channel and the laminar flow of the processing fluid inside the processing chamber in the second embodiment. This second embodiment is different from the first embodiment largely in that the upper surface of the discharge guide portion 153 is finished to be flush with the substrate-facing surface 151. In other words, the upper surface of the discharge guide portion 153 is continuous with the substrate-facing surface 151, and the downstream side of the substrate S is open in the flow direction FD. Therefore, the upper-stage laminar flow FL1 having flowed along the substrate upper surface Sa and the middle-stage laminar flow FL2 having flowed along the substrate lower surface Sb are guided to the upstream region 181. By adopting such a structure (hereinafter, referred to as a "discharge-side fully open structure"), in the path of the middle-stage laminar flow FL2, the downstream path positioned on the downstream side (i.e., the (−Y) side) in the flow direction FD is significantly wider than the upstream path positioned on the upstream side (i.e., the (+Y) side) in the flow direction FD. Therefore, the pressure loss in the path of the middle-stage laminar flow FL2 is largely reduced. As a result, it is possible to more efficiently discharge the liquid from the processing chamber 100 and more effectively prevent re-adhesion of the liquid on the substrate S, as compared with the first embodiment adopting the downstream-side gap enlarged structure.

Further, though the downstream side of the substrate S in the flow direction FD is fully open in the second embodiment, a height of the discharge guide portion 153 may be set lower than that in the first embodiment. Specifically, it may be configured so that the upper surface of the discharge guide portion 153 can be positioned lower than the upper surface of the supply guide portion 152, to adjust the degree of openness on the downstream side of the substrate S. By adopting such a structure (hereinafter, referred to as a "discharge-side openness adjusted structure"), the same action and effect as in the second embodiment can be produced.

Figure 8:
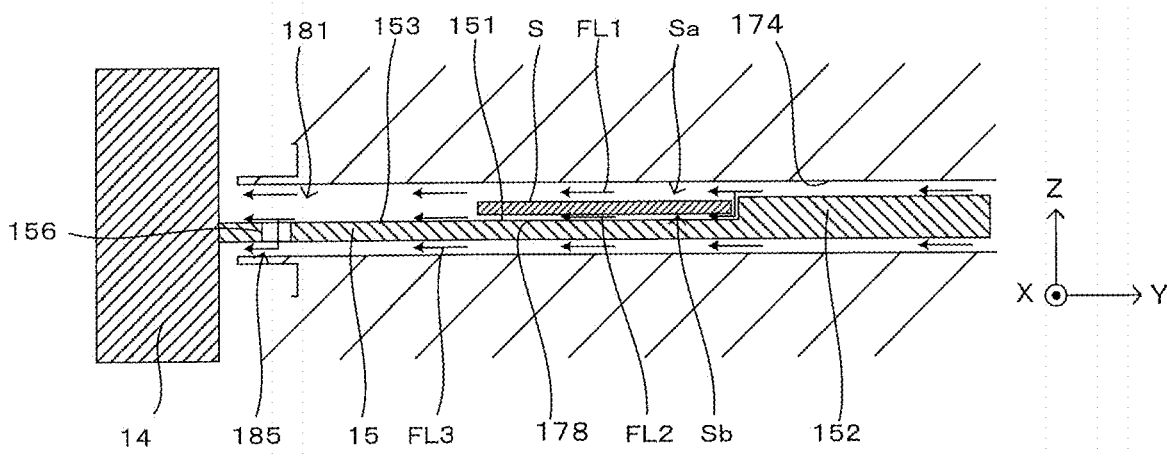
FIG. 8 is a view schematically showing the flow channel and the laminar flow of the processing fluid inside the processing chamber in the third embodiment.

FIG. 7 is a plan view showing the lid member, the support tray, and the substrate supported by the support tray in a third embodiment of the substrate processing apparatus in accordance with the present invention, as viewed from vertically above. FIG. 8 is a view schematically showing the flow channel and the laminar flow of the processing fluid inside the processing chamber in the third embodiment, and shows a cross section taken along the D-D line of FIG. 7. This third embodiment is different from the second embodiment largely in that a through hole 156 for bypass is added to the support tray 15. The through holes 156 are provided on the downstream side, i.e., the (−Y) side of the substrate S in the flow direction FD so as to penetrate the discharge guide portion 153 in the vertical direction Z. For this reason, as indicated by the arrow in FIG. 7, part of the processing fluid forming the middle-stage laminar flow FL2 goes through between the substrate lower surface Sb and the substrate-facing surface 151 and then flows into the upstream region 185 of the exhaust flow channel 18 through the upstream region 181 and the through hole 156. Then, the processing fluid meets the processing fluid forming the lower-stage laminar flow FL3 and is collected by the fluid discharger 55 through the downstream region 187 and the output port 105. In other words, the bypass-dedicated through hole 156 is added, besides the through hole 155 for elevating the lift pin 201. By adopting such a structure (hereinafter, referred to as a "bypass added structure"), in the path of the middle-stage laminar flow FL2, the downstream path positioned on the downstream side (i.e., the (−Y) side) in the flow direction FD is wider than the upstream path positioned on the upstream side (i.e., the (+Y) side) in the flow direction FD. Therefore, the pressure loss in the path of the middle-stage laminar flow FL2 is reduced.

Further, in the third embodiment, as shown in FIG. 7, the two bypass-dedicated through holes 156 are provided, being divided into the (+X) side and the (−X) side with respect to the substrate S in a horizontal direction X orthogonal to the flow direction FD. In other words, the bypass-dedicated through holes 156 are provided in the vicinity of the output port 105. For this reason, as indicated by the arrow in FIG. 7, part of the processing fluid forming the middle-stage laminar flow FL2 is spread toward the bypass-dedicated through hole 156 and efficiently discharged through the bypass-dedicated through hole 156 and the output port 105.

As a result, the substrate processing apparatus 1 in accordance with the third embodiment can more efficiently discharge the processing fluid from the processing chamber 100, as compared with the first embodiment adopting the downstream-side gap enlarged structure. As a result, it is possible to more effectively prevent re-adhesion of the liquid on the substrate S. Thus, in the third embodiment, the bypass-dedicated through hole 156 corresponds to one example of a "first through hole" of the present invention.

FIG. 9 is a plan view showing the lid member, the support tray, and the substrate supported by the support tray in a fourth embodiment of the substrate processing apparatus in accordance with the present invention, as viewed from vertically above. FIG. 10 is a view schematically showing the flow channel and the laminar flow of the processing fluid inside the processing chamber in the fourth embodiment, and shows a cross section taken along the E-E line of FIG. 9. This fourth embodiment is different from the third embodiment largely in that part of the substrate-facing surface 151 and the upper surface of the discharge guide portion 153 are finished to be a sloped surface 157. This sloped surface 157 is provided in a downstream-side region of the substrate-facing surface 151 in the flow direction FD and an entire region on the upper surface of the discharge guide portion 153, and the whole of these regions corresponds to one example of a "sloped region" of the present invention. This sloped surface 157 is so inclined as to get further away from the substrate lower surface Sb as it goes toward the downstream side in the flow direction FD. Further, in FIG. 9, for clear illustration of the sloped surface 157, dots are given to a region in which the sloped surface 157 is provided. By adopting such a structure (hereinafter, referred to as a "sloped structure"), in the path of the middle-stage laminar flow FL2, the downstream path positioned on the downstream side (i.e., the (−Y) side) in the flow direction FD is wider than the upstream path positioned on the upstream side (i.e., the (+Y) side) in the flow direction FD. Therefore, the pressure loss in the path of the middle-stage laminar flow FL2 is reduced. Further, though each portion of the sloped surface 157 has the same tilt angle in the present embodiment, the sloped surface 157 may partially have portions having different tilt angles. For example, the tilt angle of the downstream-side region of the substrate-facing surface 151 and that of the entire region on the upper surface of the discharge guide portion 153 may be different from each other. Further, the entire substrate-facing surface 151 may be sloped.

Further, in the fourth embodiment, the slope destination goes toward the bypass-dedicated through hole 156. Therefore, as indicated by the arrow in FIG. 9, part of the processing fluid forming the middle-stage laminar flow FL2 is guided to the bypass-dedicated through hole 156 by the sloped surface 157 and efficiently discharged through the bypass-dedicated through hole 156 and the output port 105.

As a result, in the substrate processing apparatus 1 in accordance with the fourth embodiment, it is possible to more efficiently discharge the liquid from the processing chamber 100 and more effectively prevent re-adhesion of the liquid onto the substrate S, as compared with the second embodiment.

Further, the present invention is not limited to the above-described embodiments, and numerous modifications and variations can be added to those described above without departing from the scope of the invention. For example, though the "downstream-side gap enlarged structure (FIG. 3)", the "tapered structure (FIG. 4)", the "discharge-side open structure (FIG. 6)", the "discharge-side openness adjusted structure", the "bypass added structure (FIGS. 7 to 10)", and the "sloped structure (FIG. 10)" are used as the a specific means for reducing the pressure loss in the path of the middle-stage laminar flow FL2 in the above-described embodiments, these may be used solely or a plurality of structures among these structures may be combined.

Further, in the support tray 15, as shown in FIGS. 2, 3, and the like, the substrate S is held by the support member 154 so that the substrate-facing surface 151 can be positioned slightly deeper than a thickness of the substrate S (the size thereof in the vertical direction Z) with respect to the upper surface of the supply guide portion 152. Herein, it is preferable that the substrate-facing surface 151 should be positioned still lower than the substrate lower surface Sb held by the support member 154, since the pressure loss in the path of the middle-stage laminar flow FL2 can be further reduced.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

INDUSTRIAL APPLICABILITY

This invention can be applied to substrate processing techniques in general for processing a substrate with a liquid adhered thereon by using a processing fluid in a supercritical state.

REFERENCE SIGNS LIST

1 substrate processing apparatus
10 processing unit
15 support tray
55 fluid discharger
57 fluid supplier
100 processing chamber
151 substrate-facing surface
152 supply guide portion
153 discharge guide portion
155*a* opening (of through hole 155)
156 bypass-dedicated through hole
157 sloped surface
200 transfer mechanism
201 lift pin
FD flow direction
FL1 upper-stage laminar flow
FL2 middle-stage laminar flow
S substrate
SG1 size (of gap between supply guide portion and substrate)

SG1 sizes (of gap between the substrate and discharge guide portion)
SP processing space
Sa substrate upper surface
Sb substrate lower surface
X horizontal direction

The invention claimed is:

1. A substrate processing apparatus for processing a substrate with a processing fluid in a supercritical state, the apparatus comprising:

a processing chamber having a processing space in which the substrate is processed;

a support part accommodated in the processing space while supporting the substrate in a horizontal position, the support part having a substrate-facing surface facing a lower surface of the substrate when the substrate is supported by the support part, and being configured to support the substrate in a state of being spaced from the support-facing surface to define a lower laminar flow path between the substrate-facing surface and the lower surface of the substrate that is supported by the support part;

a fluid supplier configured to supply the processing fluid into the processing chamber, to thereby cause the processing fluid to flow in a certain direction from an upstream position to a downstream position in the processing space; and a fluid discharger configured to discharge the processing fluid from the processing chamber, wherein the lower laminar flow path extends from the upstream position to the downstream position, wherein the lower laminar flow path includes a downstream path section and an upstream path section, wherein the upstream path section merges with the downstream path section, and wherein a distance between the substrate-facing surface and the lower surface of the substrate at the downstream path section is larger than a distance between the substrate-facing surface and the lower surface of the substrate at the upstream path section.

2. The substrate processing apparatus according to claim 1, wherein the support part has a supply guide portion standing upward from the substrate-facing surface on an upstream side of the substrate-facing surface in the certain direction, and configured to guide the processing fluid that has supplied from the fluid supplier onto an upper surface of the substrate; and a discharge guide portion standing upward from the substrate-facing surface on a downstream side of the substrate-facing surface in the certain direction, and configured to guide the processing fluid that has flowed along the upper surface of the substrate to the fluid discharger, and a separation distance of the discharge guide portion from the substrate is longer than that of the supply guide portion from the substrate.

3. The substrate processing apparatus according to claim 1, wherein the support part has a supply guide portion standing upward from the substrate-facing surface on an upstream side of the substrate-facing surface in the certain direction, and configured to guide the processing fluid that has supplied from the fluid supplier onto an upper surface of the substrate; and a discharge guide portion provided on a downstream side of the substrate-facing surface in the certain direction, and configured to guide the processing fluid that forms the laminar flow to the fluid discharger, and an upper surface of the discharge guide portion is positioned lower than that of the supply guide portion.

4. The substrate processing apparatus according to claim 3, wherein the upper surface of the discharge guide portion is flush with the substrate-facing surface.

5. The substrate processing apparatus according to claim 1, wherein the substrate-facing surface has a sloped region that is so inclined as to get further away from the lower surface of the substrate as it goes toward the downstream side in the certain direction.

6. The substrate processing apparatus according to claim 3, wherein the upper surface of the discharge guide portion is continuous with the substrate-facing surface, and the upper surface of the discharge guide portion and the substrate-facing surface have a sloped region that is so inclined as to get further away from the lower surface of the substrate as it goes toward the downstream side in the certain direction.

7. The substrate processing apparatus according to claim 2, wherein the discharge guide portion has a first through hole penetrating from the upper surface to a lower surface thereof and is configured to guide the processing fluid that forms the laminar flow to the fluid discharger through the first through hole.

8. The substrate processing apparatus according to claim 7, wherein the first through hole narrows as it extends from the upper surface to the lower surface.

9. The substrate processing apparatus according to claim 1, further comprising:

a lift pin operated to move in an up-and-down direction into and out from a second through hole outside the processing chamber, the second through hole provided in the support part so as to penetrate the substrate-facing surface downward, wherein the second through hole narrows as it extends from the substrate-facing surface into the support part.

10. A substrate processing method for processing a substrate with a processing fluid in a supercritical state, the method comprising:

(a) accommodating a support part into a processing space of a processing chamber, the support part having a substrate-facing surface facing a lower surface of the substrate when the substrate is supported by the support part, and being configured to support the substrate in a state of being spaced from the support-facing surface to define a lower laminar flow path between the substrate-facing surface and the lower surface of the substrate that is supported by the support part; and (b) processing the substrate supported by the support part inside the processing space by using the processing fluid, by supplying the processing fluid into the processing chamber that accommodates the support part therein to thereby cause the processing fluid to flow in a certain direction from an upstream position to a downstream position in the processing space and discharging the processing fluid that flows in the certain direction along an upper surface of the substrate and the processing fluid that flows between the support part and the substrate, from the processing chamber, wherein the lower laminar flow path extends from the upstream position to the downstream position, wherein the lower laminar flow path includes a downstream path section and an upstream path section, wherein the upstream path section merges with the downstream path section, and wherein a distance between the substrate-facing surface and the lower surface of the substrate at the downstream path section is larger than a distance between the substrate-facing surface and the lower surface of the substrate at the upstream path section.

* * * * *